United States Patent
Ito et al.

(10) Patent No.: US 8,497,217 B2
(45) Date of Patent: Jul. 30, 2013

(54) FILM FORMING APPARATUS AND FILM-FORMING METHOD

(75) Inventors: Takahiro Ito, Aichi-ken (JP); Kenji Nakashima, Nisshin (JP)

(73) Assignee: Toyota Jidosha Kabushiki Kaisha, Aichi-ken (JP)

( * ) Notice: Subject to any disclaimer, the term of this patent is extended or adjusted under 35 U.S.C. 154(b) by 61 days.

(21) Appl. No.: 13/151,081

(22) Filed: Jun. 1, 2011

(65) Prior Publication Data
US 2011/0230055 A1    Sep. 22, 2011

Related U.S. Application Data

(63) Continuation of application No. PCT/JP2009/064118, filed on Aug. 10, 2009.

(30) Foreign Application Priority Data

Dec. 2, 2008 (JP) ................................. 2008-307492

(51) Int. Cl.
*H01L 21/205* (2006.01)

(52) U.S. Cl.
USPC ............. 438/758; 118/725; 257/E21.102

(58) Field of Classification Search
USPC ............. 118/722, 724, 725; 257/E21.211, 257/E21.101, E21.102; 427/248.1, 255.11, 427/255.17, 255.18, 255.27, 255, 393; 438/758, 438/761, 762, 764, 765, 767, 769

See application file for complete search history.

(56) References Cited

U.S. PATENT DOCUMENTS

| | | | |
|---|---|---|---|
| 6,087,580 | A | 7/2000 | Ovshinsky et al. |
| 2003/0124820 | A1 | 7/2003 | Johnsgard et al. |
| 2005/0133159 | A1 | 6/2005 | Johnsgard et al. |
| 2008/0193646 | A1 | 8/2008 | Suzuki et al. |

FOREIGN PATENT DOCUMENTS

| | | | |
|---|---|---|---|
| JP | 2-93070 A | | 4/1990 |
| JP | 2001-506407 A | | 5/2001 |
| JP | 2008-198752 A | | 8/2008 |
| JP | 2008-244502 A | | 10/2008 |
| JP | 2009-135159 A | | 6/2009 |
| JP | 2009135159 A | * | 6/2009 |

OTHER PUBLICATIONS

Japanese Office Action mailed on Sep. 29, 2009 (issued for JP patent application No. 2008-307492) with English translation.
Japanese Office Action mailed on Dec. 22, 2009 (issued for JP patent application No. 2008-307492) with English translation.

(Continued)

*Primary Examiner* — Julio J Maldonado
*Assistant Examiner* — Daniel Shook
(74) *Attorney, Agent, or Firm* — Sughrue Mion, PLLC

(57) ABSTRACT

A film forming apparatus and a film forming method for suppressing a drop in the film forming speed caused by-product gas are provided. A film forming apparatus for forming a film on a wafer includes a chamber in which the wafer is located; a gas introducing member configured to introduce raw material gas into the chamber, in which the raw material gas turning into by-product gas and a substance which adheres to the surface of the wafer by reacting at a surface of the wafer; and a reverse reaction member configured to generate the raw material gas by causing the by-product gas to react in the chamber.

6 Claims, 4 Drawing Sheets

OTHER PUBLICATIONS

Japanese Decision of Rejection mailed on Sep. 21, 2010 (issued for JP patent application No. 2008-307492) with English translation.
Japanese Decision to Dismiss the Amendment mailed on Sep. 21, 2010 (issued for JP patent application No. 2008-307492) with English translation.
Japanese Office Action mailed on Apr. 5, 2011 (issued for JP patent application No. 2008-307492) with English translation.
International Search Report for PCT/JP2009/064118 dated Oct. 6, 2009.
Written Opinion of the International Searching Authority for PCT/JP2009/064118 dated Oct. 6, 2009.
International Preliminary Report on Patentability for PCT/JP2009/064118 dated Jul. 5, 2011.
Japanese Decision of Rejection mailed on Sep. 21, 2009 (issued for JP patent application No. 2008-307492) with English translation.
Japanese Decision to Dismiss the Amendment mailed on Sep. 21, 2009 (issued for JP patent application No. 2008-307492) with English translation.
Japanese Office Action mailed on Apr. 5, 2009 (issued for JP patent application No. 2008-307492) with English translation.
International Search Report dated Oct. 6, 2009.
Written Opinion of the International Searching Authority dated Oct. 6, 2009.

* cited by examiner

FILM FORMING APPARATUS AND FILM-FORMING METHOD

CROSS-REFERENCE TO RELATED APPLICATION

This application is a continuation of PCT application serial no. PCT/JP2009/064118 filed on Aug. 10, 2009, which PCT application designates the United States of America and claims priority to Japanese patent application serial no. 2008-307492 filed on Dec. 2, 2008. PCT application serial no. PCT/JP2009/064118 and Japanese patent application serial no. 2008-307492 are both hereby incorporated by reference in their entirety.

FIELD

The present application relates to a film forming technology for growing a film on a surface of a wafer.

DESCRIPTION OF RELATED ART

There is a known technology for growing a film on a surface of a wafer by introducing raw material gas into a chamber in a state with the wafer being located in the chamber.

Japanese Patent Application Publication No. 2008-198752 (hereafter Patent Literature 1) discloses a film forming apparatus for growing a silicon film on a surface of a silicon wafer. This film forming apparatus includes a chamber in which the silicon wafer is located, and a gas introducing member configured to introduce mixed gas (raw material gas) of silicon chloride gas, such as trichlorosilane, and hydrogen gas, into the chamber. By introducing the raw material gas into the chamber while heating the silicon wafer, the hydrogen gas and the silicon chloride gas react with each other at a surface of a silicon. Due to this, the silicon film grows on the surface of the silicon wafer.

BRIEF SUMMARY

A problem of the above mentioned film forming technology is that the film forming speed is slow. Particularly in recent years, a thick film is required for manufacturing power semiconductor apparatuses that handle heavy current. In order to form such a thick film, a long time is required, which considerably drops the efficiency of manufacturing semiconductor apparatuses. Therefore a film forming technology of which film forming speed is much faster is demanded. The present inventors discovered that the following phenomenon is one cause which makes the film forming speed slow. If raw material gas reacts at a surface of a wafer, a substance which adheres to the surface of the wafer (that is, a substance to be the film on the surface of the wafer) and a by-product gas are generated. The generated by-product gas is exhausted out of the chamber, but all of the by-product gas cannot be exhausted out of the chamber. A part of the generated by-product gas convects in the chamber. The convecting by-product gas mixes with the raw material gas introduced into the chamber, and flows to the surface of the wafer. If the by-product gas mixes with the raw material gas and flows to the surface of the wafer as aforementioned, the film forming reaction at the surface of the wafer is obstructed, and the film forming speed drops. For example, according to the technology of the Patent Literature 1, the hydrogen gas and the silicon chloride gas react at the surface of the silicon wafer, whereby the silicon film (silicon crystal) is grown on the surface of the wafer, and on the other hand, hydrochloric acid gas (HCl gas) is generated as the by-product gas. A part of the generated hydrochloric acid convects in the chamber, mixes with the raw material gas (hydrogen gas and silicon chloride gas), and flows to the surface of the silicon wafer. As a result, the hydrochloric acid gas and the silicon film react with each other, and the hydrogen gas and the silicon chloride gas are generated. In other words, reverse reaction (etching reaction to etch the silicon film) of the reaction of the hydrogen gas and the silicon chloride gas (film forming reaction) occurs at the surface of the wafer. Due to this, according to the technology of the Patent Literature 1, the film forming speed is high immediately after the start of forming the film, but once a predetermined time elapses from the start of forming the film, the density of the hydrochloric acid gas in the chamber increases, and the film forming speed drops.

The technology disclosed in the present specification has been created with the foregoing in view, and an object is to provide a film forming apparatus and a film forming method which can suppress the drop in the film forming speed due to the by-product gas.

A film forming apparatus disclosed in the present specification forms a film on a wafer. The film forming apparatus comprises a chamber, a gas introducing member, and a reverse reaction member. A wafer is located in the chamber. The gas introducing member introduces raw material gas into the chamber. The raw material gas turns into by-product gas and a substance which adheres to the surface of the wafer by reacting at the surface of the wafer. The reverse reaction member generates the raw material gas by causing the by-product gas to react in the chamber. Note that the gas introducing member may introduce not only the raw material gas, but also other gases. For example, in a case of growing a silicon film on a surface of a wafer, dopant gas for doping P-type or N-type impurities may be introduced into the silicon film, in addition to the raw material gas. The raw material gas may be gas which reacts with another raw material gas so as to form a film on a surface of a wafer, just like the above mentioned case of the hydrogen gas and the silicon chloride gas, or may be gas which reacts with a wafer so as to form a film on a surface of the wafer. According to this film forming apparatus, the reverse reaction member generates the raw material gas in the chamber by causing the by-product gas to react in the chamber. Therefore, a quantity of the by-product gas decreases and a quantity of the raw material gas increases in the chamber. Consequently the obstruction of the film forming reaction by the by-product gas is suppressed. According to this film forming apparatus, a film can be formed on a surface of a wafer at a high film forming speed.

In the above mentioned film forming apparatus, the wafer made of silicon can be located in the chamber. In this case, the gas introducing member can introduce a first raw material gas and a second raw material gas including silicon into the chamber. As a result, the first raw material gas and the second raw material gas react with each other at the surface of the wafer, and turn into the by-product gas and the silicon crystal which adheres to the surface of the wafer. In this case, it is preferable that the reverse reaction member comprises a reverse reaction material including silicon. The reverse reaction member may create the first raw material gas and the second raw material gas by causing the reverse reaction material to reach with the by-product gas. According to this configuration, a silicon film can be formed efficiently on the surface of the wafer.

In the film forming apparatus which uses the second raw material gas including silicon, the reverse reaction material may be a silicon block placed on a path of the by-product gas flowing in the chamber. It is preferable that the film forming apparatus further comprises a first heating member for heating the silicon block, and a second heating member for heating the wafer to a higher temperature than the silicon block. By keeping the wafer at a higher temperature than the silicon block, a film forming reaction (reaction of the first raw material gas and the second raw material gas by which silicon crystal grows on the surface of the wafer) can occur dominantly at the surface of the wafer. By keeping the silicon block at a lower temperature than the wafer, an etching reaction (reaction of the by-product gas with the silicon of the silicon block by which the silicon block is etched and the first raw material gas and the second raw material gas are generated) can occur dominantly at the surface of the silicon block. Consequently the supply of the by-product gas to the surface of the wafer can be suppressed. Therefore, the silicon film can be formed efficiently on the surface of the wafer.

In the above mentioned film forming apparatus, it is preferable that the reverse reaction material is placed on a path along which gas convecting in the chamber flows from a peripheral edge of the wafer to a confluent point with the raw material gas. According to this configuration, the reverse reaction material can contact the gas which passed an area that is near the surface of the wafer and includes a highest quantity of the by-product gas. Therefore the by-product gas can be decreased efficiently.

The above mentioned film forming apparatus may further comprise a holder comprising a mounting portion on which the wafer is mounted, and a bladed wheel comprising a plurality of blades located around the mounting portion of the holder. By the bladed wheel rotating with the holder as a center, the gas above the holder is sent to an outer circumference side. In this case, it is preferable that the plurality of blades is made of the reverse reaction material. According to this configuration, gas above the holder (that is, the area near the surface of the wafer) can be sent to the outer circumference side of the bladed wheel by rotating the bladed wheel, so that new material gas can be supplied to the area near the surface of the wafer. Since the plurality of blades is made of the reverse reaction material, the by-product gas, included in the gas which is sent by the blades, reacts with the blades (reverse reaction material). Consequently the by-product gas can be decreased. The gas which is sent by the blades is gas which passed the area near the surface of the wafer, and therefore includes a high quantity of the by-product gas. Hence the by-product gas can be decreased efficiently by constituting the blades by the reverse reaction material.

The present specification provides a film forming method for forming a film on a surface of a wafer located in a chamber. The film forming method comprises a step of generating by-product gas and a substance which adheres to the surface of the wafer by introducing raw material gas into the chamber and causing the raw material gas to react at the surface of the wafer, and a step of generating the raw material gas in the chamber by causing the by-product gas to react in the chamber. According to this film forming method, a film can be formed efficiently on the surface of the wafer.

According to the film forming apparatus and the film forming method disclosed in the present specification, the raw material gas is generated from the by-product gas generated by the film forming reaction. Thereby the quantity of the by-product gas in the chamber can be decreased, and the obstruction of the film forming reaction by the by-product gas can be suppressed. Consequently a film can be formed at high film forming speed.

DETAILED DESCRIPTION OF PREFERRED EMBODIMENT

Major features of embodiments to be described hereinbelow will be listed first.

(Feature 1) A gas introducing member introduces raw material gas toward a surface of a wafer. A film forming apparatus includes a rotating member for rotating the wafer and an exhausting member for exhausting gas out of a chamber. Due to this, the introduced raw material gas flows toward the surface of the wafer, and then flows to a peripheral edge of the wafer along the surface of the wafer. A part of the gas, which has passed the surface of the wafer (that is, after reaction thereon), is exhausted by the exhausting member and the remaining gas flows toward the raw material gas introducing portion side along an outer circumference wall of the chamber, and joins with the introduced material gas (that is, the remaining gas convects in the chamber).

(Feature 2) A reverse reaction member includes a silicon block placed on a path along which the gas convecting in the chamber flows from a peripheral edge of the wafer to the raw material gas introducing portion. More specifically, the reverse reaction member includes a silicon block placed near an outer circumferential wall of the chamber.

(Feature 3) The gas introducing member introduces first raw material gas composed of hydrogen gas and second raw material gas composed of silicon chloride gas (e.g. $SiH_2Cl_2$, $SiHCl_3$, $SiCl_4$) into the chamber. The gas introducing member also introduces dopant gas into the chamber.

(Feature 4) At the surface of the wafer, a film forming reaction (reaction of the first raw material gas and the second raw material gas by which silicon crystal grow and by-product gas is generated) and an etching reaction (reaction of the by-product gas and the silicon crystal by which the silicon crystals are etched and the first material gas and the second raw material gas are generated) occur. At the surface of the silicon block, the film forming reaction and the etching reaction occur.

(Feature 5) The film forming apparatus includes a first heating member for heating the silicon block and a second heating member for heating the wafer. The first heating member heats the silicon block to a temperature at which the etching reaction occurs more dominantly than the film forming reaction on the surface of the silicon block. The second heating member heats the wafer to a temperature at which the film forming reaction occurs more dominantly than the etching reaction on the surface of the wafer.

(First Embodiment)

Figure 1:
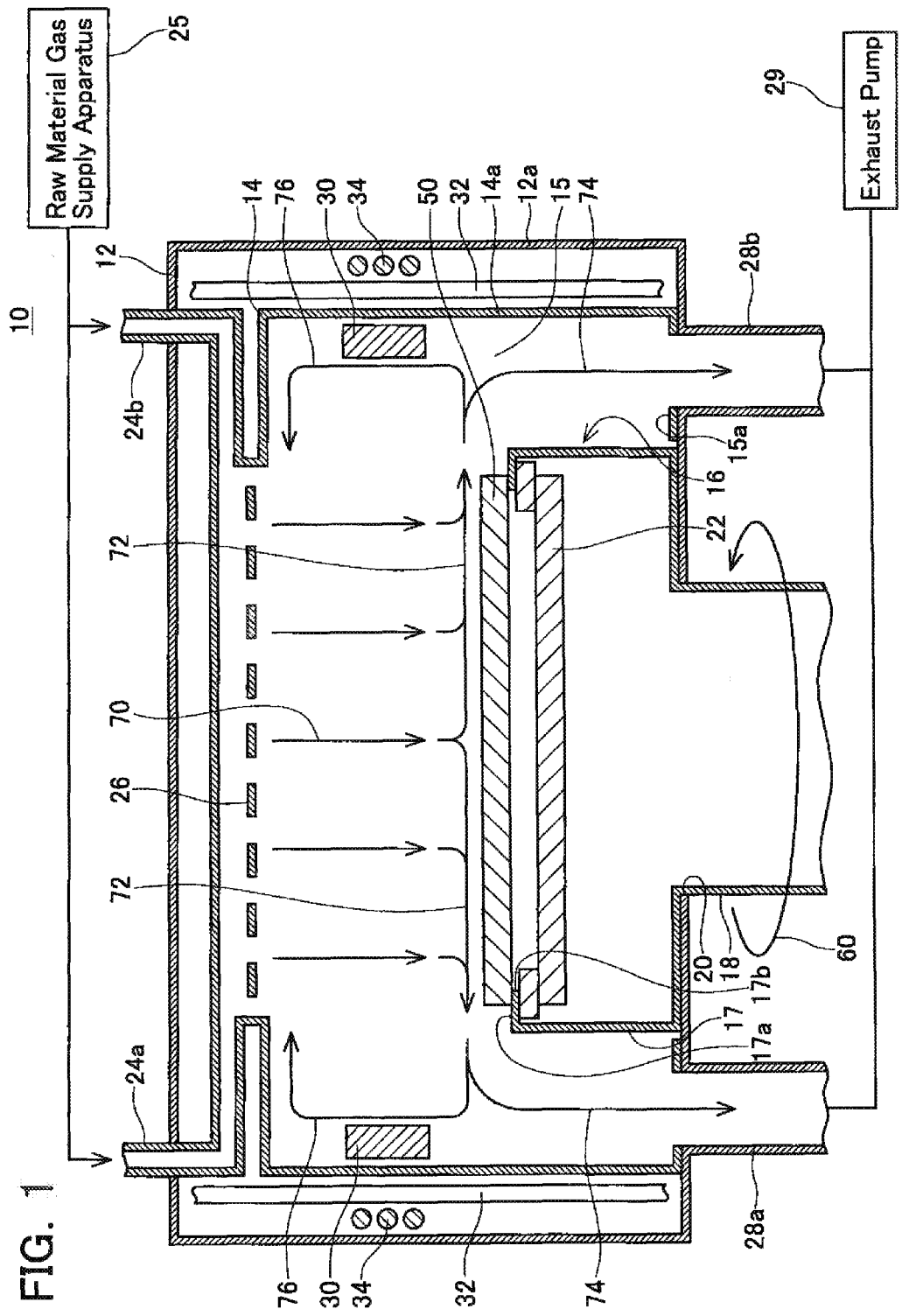
FIG. 1 is a schematic cross-sectional view of a film forming apparatus 10 of a first embodiment.

A film forming apparatus according to a first embodiment will be described. FIG. 1 is a schematic cross-sectional view of the film forming apparatus 10 of the first embodiment. The film forming apparatus 10 grows an epitaxial layer of silicon on a surface of a silicon wafer 50. As FIG. 1 shows, the film forming apparatus 10 has a first enclosure 12 and a second enclosure 14 which is placed in the first enclosure 12. A chamber 15 is formed by an internal space of the second enclosure 14. An inner surface of the chamber 15 is covered with high purity quartz or SiC. A holder 16 and a silicon ring 30 are placed in the chamber 15.

The holder 16 is a cylindrical member and has a holder portion 17 of which diameter is large and a shaft portion 18 of which diameter is small. A bearing portion 20 is formed at a base portion of the enclosure 12. The shaft portion 18 of the holder 16 is inserted into the bearing portion 20. Due to this, the holder 16 is installed in the bearing portion 20 so as to rotatable as indicated by an arrow mark 60 in FIG. 1. The holder 16 is rotated by a drive device, which is not illustrated. The holder portion 17 is located in the chamber 15. A top face 17a of the holder portion 17 is a mounting surface where the silicon wafer 50, which is an object on which the epitaxial layer grows, is mounted. An aperture 17b is formed at a center of the mounting surface 17a. The silicon wafer 50 is mounted on the mounting surface 17a so as to close the aperture 17b. A resistance heating type heater 22 is placed inside the holder portion 17. The heater 22 is placed directly beneath the aperture 17b. Therefore the silicon wafer 50 mounted on the mounting surface 17a can be heated by the heater 22.

Figure 2:
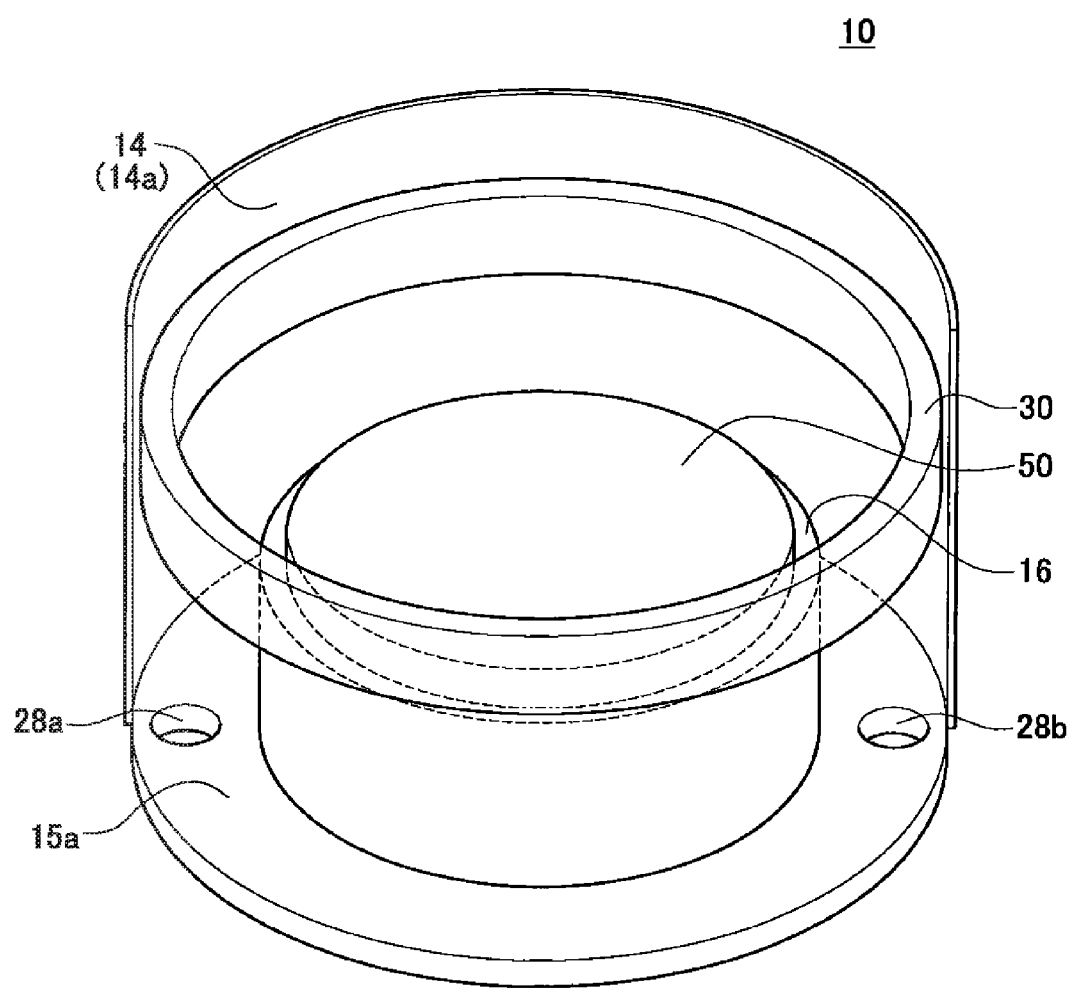
FIG. 2 shows a schematic perspective view of an inside of a chamber 15 of the film forming apparatus 10 of the first embodiment.

A silicon ring 30 is a block made of high purity silicon. FIG. 2 is a perspective view depicting a general configuration inside the chamber 15. As FIG. 2 shows, the silicon ring 30 has a ring shape. The silicon ring 30 is disposed along an outer circumferential wall of the chamber 15 (that is, an outer circumferential wall 14a of the enclosure 14). As FIG. 1 shows, the silicon ring 30 is located to be at a position higher than the silicon wafer 50 mounted on the mounting surface 17a.

Raw material gas supply passages 24a and 24b are connected to an upper part of the chamber 15. The raw material gas supply passages 24a and 24b are extend out from the enclosure 12, and upstream ends thereof are connected to a raw material gas supply apparatus 25. The raw material gas supply apparatus 25 supplies mixed gas of $H_2$ gas (hydrogen gas), $SiHCl_3$ gas (trichlorosilane gas) and $PH_3$ gas (hydrogen phosphide gas) into the raw material gas supply passages 24a and 24b. This mixed gas is hereafter called "raw material mixed gas". The $H_2$ gas and the $SiHCl_3$ gas are gases for growing the epitaxial layer of the silicon on the surface of the silicon wafer 50 by reacting with each other. The $PH_3$ gas is dopant gas for doping phosphorus into the epitaxial layer so as to make the epitaxial layer N-type. In the upper portion of the chamber 15, a shower plate 26 is placed so as to separate the raw material gas supply passages 24a and 24b from the chamber 15. The shower plate 26 has many through-holes, which penetrate from the front face to the rear face of the shower plate 26. Therefore the raw material mixed gas, which is supplied from the raw material gas supply apparatus 25, is supplied into the chamber 15 via the raw material gas supply passages 24a and 24b and the shower plate 26.

Exhaust passages 28a and 28b are connected to a bottom surface 15a of the chamber 15. Downstream ends of the exhaust passages 28a and 28b are connected to an exhaust pump 29. The exhaust pump exhausts the gas in the exhaust passages 28a and 28b. By activating the exhaust pump 29, pressure inside the chamber 15 can be reduced.

A water-cooling tube 32 is disposed between the outer circumferential wall 14a of the enclosure 14 (that is, the outer circumferential wall of the chamber 15) and an outer circumferential wall 12a of the enclosure 12. Cold water can flow in the water-cooling tube 32. By the water-cooled tube 32, the outer circumferential wall 14a of the enclosure 14 can be cooled. Consequently the gas in the chamber can be prevented from reacting on the surface of the outer circumferential wall 14a in the chamber 15.

An induction heating coil 34 is disposed between the outer circumferential wall 14a of the enclosure 14 (that is, the outer circumferential wall of the chamber 15) and the outer circumferential wall 12a of the enclosure 12. The induction heating coil 34 is disposed at outer side of the water-cooling tube 32. The induction heating coil 34 is disposed at roughly same height as the silicon ring 30 (i.e. at a position corresponding to the silicon ring 30). The induction heating coil 34 is connected to a high frequency power supply, which is not illustrated. The induction current flows in the silicon ring 30 if the high frequency power supply supplies the induction heating coil 34 with a high frequency current. As a result, the silicon ring 30 can be heated.

A processing for growing the epitaxial layer on the surface of the silicon wafer 50 (film forming processing) by the film forming apparatus 10 will now be described. When the film forming processing is executed, the silicon wafer 50 is mounted on the mounting surface 17a of the holder 16. Each portion of the film forming apparatus 10 is then controlled as follows. The exhaust pump 29 is activated so that the pressure inside the chamber 15 is maintained at 760 Torr or less. Cold water is circulated in the water-cooling tube 32 to cool the outer circumferential wall 14a of the enclosure 14. The holder 16 is rotated at approximately 1000 rpm rotation speed. The heater 22 is activated so as to maintain the temperature of the silicon wafer 50 at approximately 1100° C. High frequency current is flown into the induction heating coil 34 to maintain the temperature of the silicon ring 30 at approximately 1000° C. Then the raw material gas supply apparatus 25 is activated to supply the raw material mixed gas into the chamber 15.

The raw material mixed gas supplied to the chamber 15 flows from the shower plate 26 to the silicon wafer 50, as indicated by the arrow marks 70 in FIG. 1. When reaching an area near the surface of the silicon wafer 50, the raw material mixed gas flows toward the outer circumference side of the wafer 50, as indicated by the arrow mark 72. Since the silicon wafer 50 is rotating at high rotation speed, flow velocity of the gas flowing along the path indicated by the arrow mark 72 is increased by being influenced by centrifugal force. Hence a flow rate of the gas flowing along the path indicated by the arrow mark 72 is higher than a flow rate of the gas supplied into the chamber 15 and a flow rate of the gas exhausted from the chamber 15. The silicon wafer 50 is heated by the heater 22, therefore the raw material mixed gas causes a reaction while flowing through an area near the silicon wafer 50. More specifically, $SiHCl_3$ gas and $H_2$ gas causes a reaction according to the following reaction formula.

$$SiHCl_3 + H_2 \rightarrow Si + 3HCl$$

Si (silicon) generated by the reaction according to the above reaction formula becomes silicon which adheres to the surface of the silicon wafer 50. In other words, the epitaxial layer (silicon layer) grows on the surface of the silicon wafer 50 by the reaction according to the above reaction formula. When the epitaxial layer is growing on the surface of the silicon wafer 50, phosphorus atoms of $PH_3$ gas are taken into the epitaxial layer. Consequently, the growing epitaxial layer becomes an N-type silicon layer. As the above reaction formula shows, HCl gas (hydrochloric acid gas) is generated after the reaction as a by-product. The reaction shown by the above reaction formula is referred to as "film forming reaction" hereinbelow.

The gas, which has flown and reached to the peripheral edge of the silicon wafer 50 as the arrow mark 72 shows, includes gas which did not react on the surface of the silicon wafer 50 ($SiHCl_3$ gas, $H_2$ gas and $PH_3$ gas) and the HCl gas generated by the reaction on the surface of the silicon wafer 50. Most of the gas which has reached to the peripheral edge of the silicon wafer 50 flows through the exhaust passages 28a and 28b, and are exhausted from the chamber 15, as indicated by the arrow marks 74. However, as mentioned above, the flow rate of the gas flowing as indicated by the arrow mark 72 is higher than the flow rate of the gas exhausted from the chamber 15 as indicated by the arrow marks 74. Hence a part of the gas flows upward (shower plate 26 side) along the outer circumferential wall 14a of the chamber 15, as indicated by the arrow marks 76. In other words, a part of the gas convects in the chamber 15. In this case, the gas passes an area near the surface of the silicon ring 30. The silicon ring 30 is heated by the induction heating coil 34, therefore the gas flowing through the area near the silicon ring 30 causes a reaction. More specifically, the $SiHCl_3$ gas and the $H_2$ gas cause the above mentioned film forming reaction. Furthermore, the HCl gas and the silicon ring 30 (that is, Si) also causes a reaction according to the following reaction formula.

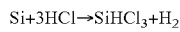

$Si+3HCl \rightarrow SiHCl_3+H_2$

In other words, the HCl gas and Si (silicon) of the silicon ring 30 reacts with each other, and $SiHCl_3$ gas and $H_2$ gas are generated. This reaction is a reverse reaction of the above mentioned film forming reaction. The silicon ring 30 is etched by this reaction. This reaction is referred to as an "etching reaction" hereinbelow. As mentioned above, the silicon ring 30 is maintained at approximately 1000° C. In this temperature range, the etching reaction occurs more dominantly than the film forming reaction. Therefore if the gas passes through the area near the surface of the silicon ring 30, the quantity of the HCl gas decreases, and the quantity of the $SiHCl_3$ gas and the $H_2$ gas increases.

The gas which has flown as indicated by the arrow marks 76 (gas including the HCl gas) merges with the raw material mixed gas supplied from the shower plate 26, and flows toward the surface of the silicon wafer 50 again, as indicated by the arrow mark 70. In other words, the HCl gas is supplied to the surface of the silicon wafer 50. Therefore on the surface of the silicon wafer 50, the above mentioned etching reaction occurs in addition to the above mentioned film forming reaction. This means that a reaction by which the HCl gas etches the epitaxial layer (silicon layer) grown on the surface of the silicon wafer 50 occurs. As mentioned above, the silicon wafer 50 is maintained at 1100° C. In this temperature range, the film forming reaction occurs more dominantly than the etching reaction, hence the epitaxial layer grows continuously. The growth speed, however, drops because of the generation of the etching reaction. As mentioned above, when the gas convects in the chamber 15 (when the gas flows as indicated by the arrow marks 76), the HCl gas is consumed by the etching reaction which occurs on the surface of the silicon ring 30, and the $SiHCl_3$ gas and the $H_2$ gas are generated. Due to this, the HCl gas, which reaches the surface of the silicon wafer 50, decreases. Consequently, the generation of the etching reaction on the surface of the silicon wafer 50 is suppressed, and a drop in the growth speed of the epitaxial layer is suppressed. As a result, according to this film forming apparatus 10, the epitaxial layer can grow faster.

As described above, according to the film forming apparatus 10 of the first embodiment, the HCl gas, which is generated by the film forming reaction, reacts with the silicon ring 30, hence the quantity of the HCl gas decreases. This means that the density of the HCl gas in the chamber 15 does not increase much, even if the film forming processing is executed continuously. Consequently the HCl gas etching of the epitaxial layer is suppressed. According to the film forming apparatus 10 of the first embodiment, the epitaxial layer can be grown at a high growth speed.

(Second Embodiment)

Figure 3:
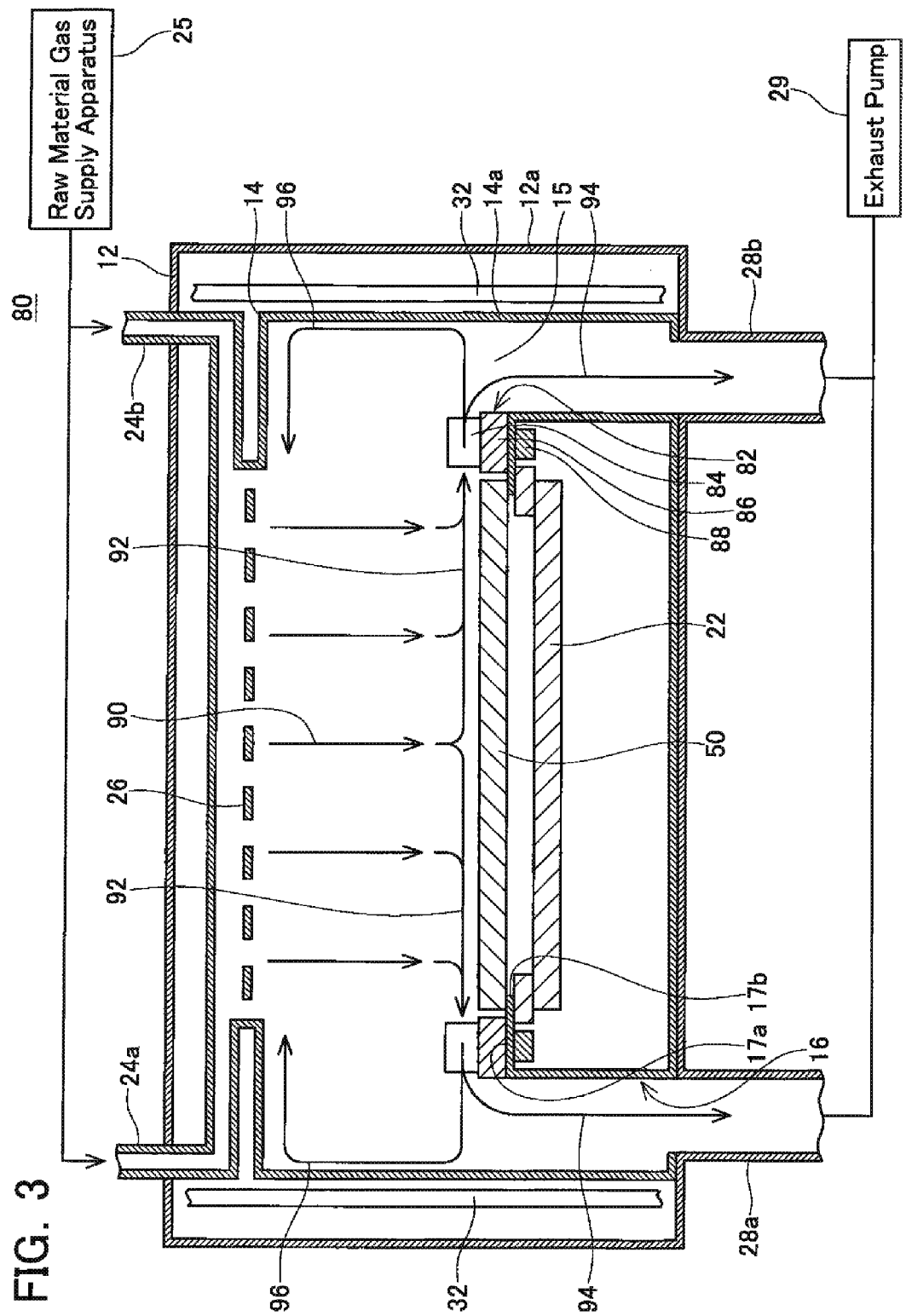
FIG. 3 is a schematic cross-sectional view of a film forming apparatus 80 of a second embodiment.

A film forming apparatus 80 according to the second embodiment will be described. In the description of each portion of the film forming apparatus 80 of the second embodiment, a portion having same function as the film forming apparatus 10 of the first embodiment is denoted with same reference number as the first embodiment. FIG. 3 is a schematic cross-sectional view of the film forming apparatus 80 of the second embodiment. Unlike the film forming apparatus 10 of the first embodiment, the film forming apparatus 80 of the second embodiment does not include the silicon ring 30 and the induction heating coil 34. Furthermore, according to the film forming apparatus 80 of the second embodiment, the holder 16 cannot be rotated and is fixed to the chamber 15. The film forming apparatus 80 of the second embodiment includes a bladed wheel 82 and a heater 88.

Figure 4:
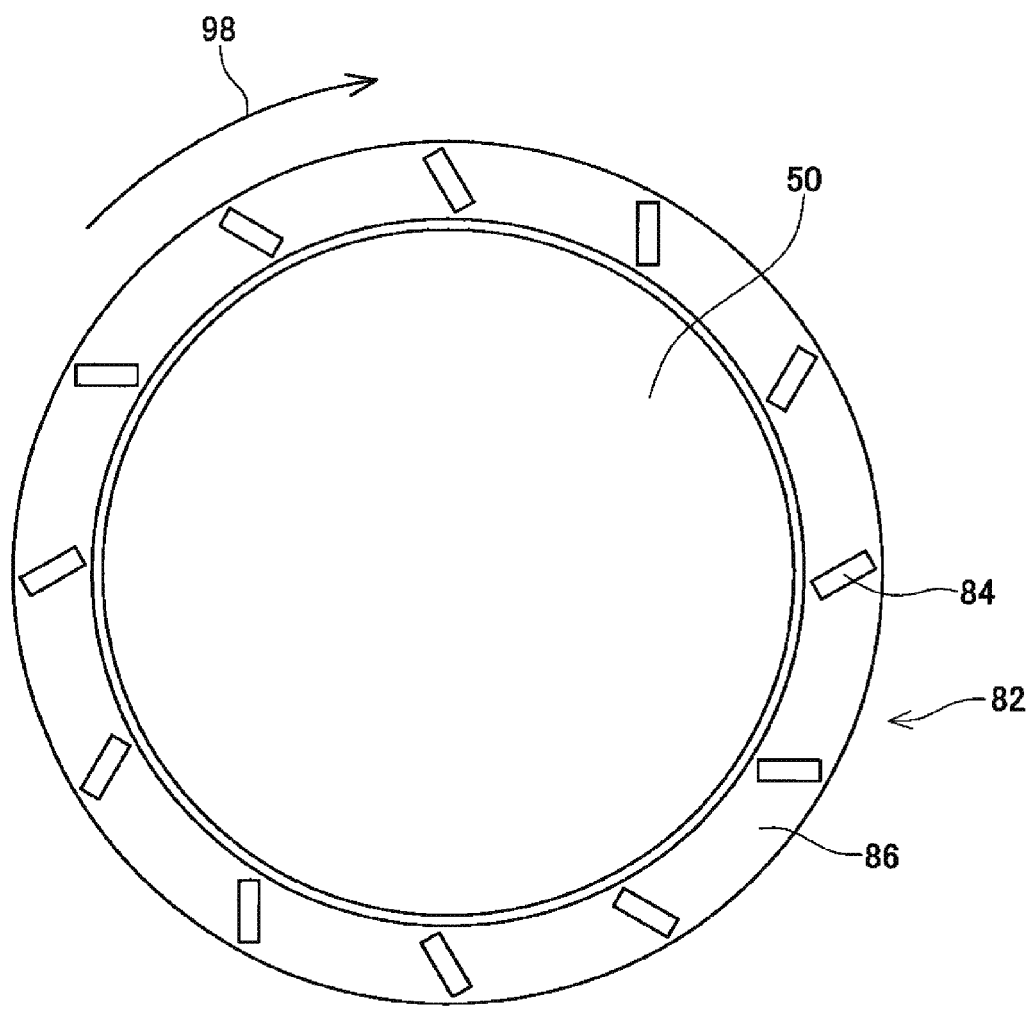
FIG. 4 is a top view of a bladed wheel 82.

The bladed wheel 82 is placed on the mounting surface 17a of the holder 16. FIG. 4 is a plan view of the bladed wheel 82 viewed from the top. As FIG. 4 shows, the bladed wheel 82 is configured of a base 86 and a plurality of blades 84. The base 86 is a plate member having a ring shape. The base 86 is placed on the mounting surface 17a of the holder 16, so as to enclose a portion where the wafer 50 is mounted (a mounting portion of the wafer 50). The base 86 can rotate around a center axis thereof as shown in an arrow mark 98 in FIG. 4. In other words, the entire bladed wheel 82 can rotate around the mounting portion of the wafer 50 as the center. The bladed wheel 82 is rotated by a drive device, which is not illustrated. The plurality of blades 84 stands on the base 86. The blades 84 are installed at an angle for sending gas from inside the bladed wheel 82 (inside the ring shape) to outside the bladed wheel 82 (outside the ring shape) when the bladed wheel 82 rotates. The blades 84 are made of high purity silicon. The heater 88 is installed beneath the bladed wheel 82 inside the holder 16. The heater 88 heats the bladed wheel 82.

A processing (film forming processing) for growing the epitaxial layer on the surface of the silicon wafer 50 by the film forming apparatus 80 will now be described. When the film forming processing is executed, the silicon wafer 50 is mounted on the mounting surface 17a of the holder 16. Each portion of the film forming apparatus 80 is then controlled as follows. The exhaust pump 29 is activated so that the pressure inside the chamber 15 is maintained at 760 Torr or less. Cold water is circulated in the water-cooling tube 32 to cool the outer circumferential wall 14a of the enclosure 14. The bladed wheel 82 is rotated. The heater 22 is activated so as to maintain the temperature of the silicon wafer 50 at approximately 1100° C. The heater 88 is activated so as to maintain the temperature of the bladed wheel 82 at approximately 1000° C. Then the raw material gas supply apparatus 25 is activated to supply the raw material mixed gas into the chamber 15.

The raw material mixed gas supplied to the chamber 15 flows from the shower plate 26 to the silicon wafer 50, as indicated by the arrow marks 90 in FIG. 3. The raw material mixed gas which has reached the area near the surface of the silicon wafer 50 is sent to the outer circumference side by the rotating bladed wheel 82, as indicated by the arrow mark 92. Most of the gas sent to the outer circumference side is exhausted out of the chamber, as indicated by the arrow marks 94, but a part of the gas convects in the chamber 15, as indicated by the arrow marks 96. Then this gas merges with the raw material mixed gas, which is supplied from the shower plate 26 as indicated by an arrow mark 90, and flows again toward the surface of the silicon wafer 50.

The epitaxial layer grows by the film forming reaction and HCl gas is generated on the surface of the silicon wafer 50.

Because of this, a high quantity of HCl gas is included in the gas passing through the bladed wheel 82, as indicated by the arrow mark 92. As mentioned above, the blades 84 of the bladed wheel 82 are made of silicon, and the bladed wheel 82 is maintained at approximately 1000° C. Therefore when the gas passes through the bladed wheel 82, the blades 84 and the gas react with each other. In this case, the above mentioned film forming reaction and the etching reaction occur, but the etching reaction occurs more dominantly. Hence the quantity of the HCl gas in the gas passing through the bladed wheel 82 decreases, and the quantity of the $SiHCl_3$ gas and the $H_2$ gas increases. This means that the quantity of the HCl gas in the gas convecting as indicated by the arrow mark 96 decreases, and the quantity of the HCl gas mixed in the raw material mixed gas, which reaches the surface of the silicon wafer 50, decreases. Consequently, the generation of the etching reaction on the surface of the silicon wafer 50 is suppressed. Therefore according to the film forming apparatus 80 of the second embodiment, the epitaxial layer can be grown faster.

As described above, according to the film forming apparatus 10 of the first embodiment and the film forming apparatus 80 of the second embodiment, the epitaxial layer can be formed faster than the conventional technology. In the above mentioned embodiments, the $SiHCl_3$ gas is used as the raw material gas, but $SiH_3Cl_2$ gas or $SiCl_4$ gas may be used instead of the $SiHCl_3$ gas. In the case of using these gases as well, the epitaxial layer of silicon can grow on the surface of the silicon wafer 50, and the generation of the by-product gas (HCl gas) can be decreased due to the etching reaction with the silicon ring 30 or the blades 84. In the above mentioned embodiments, the silicon block (that is, the silicon ring 30 and the blades 84) is used as the reverse reaction material for decreasing the HCl gas. However the shape of the silicon block can be changed as considered appropriate according to necessity. The position where the silicon block is placed can also be changed as considered appropriate so long as the position allows the silicon block to react with the HCl gas. The reverse reaction material is not limited to silicon. The material can be changed as considered appropriate so long as the material includes silicon and reacts with the HCl gas. The reverse reaction material is not limited to a block object. The reverse reaction material can be any of gas, liquid or solid. The reverse reaction material may be supplied into the chamber 15 when necessary, instead of placing the reverse reaction material in the chamber 15. In the above mentioned embodiments, an example of forming a film on the surface of the silicon wafer was described, but a target wafer on which a film is formed is not limited to a silicon wafer. For example, the technology disclosed in the present specification may be applied to a case of forming a film on a surface of an SiC wafer. In the above mentioned embodiments, an example of growing a silicon epitaxial layer (layer of single crystals) was described, but the technology disclosed in the present specification may be applied to growing another layer. For example, the technology disclosed in the present specification may be applied to a case of growing a layer of another material, such as SiC. The technology disclosed in the present specification may also be applied to a case of growing a layer of polycrystals, instead of the epitaxial layer. In the above mentioned embodiment, an example of the $H_2$ gas and the $SiHCl_3$ gas (both raw material gases), reacting with each other to form a film was described, but the technology disclosed in the present specification may be applied to a case of forming a film by raw material gas and a wafer reacting with each other to form a film. In the above mentioned embodiments, the resistance heating type heater and the induction heating coil are used as the heater, but various devices can be used for the heater, and a lamp annealing device, for example, may be used.

Embodiments of the technology disclosed in the present specification were described in detail, but these are merely examples and are not for limiting the Claims. The technology stated in the Claims includes numerous modifications and variations of the embodiments described above. The technical elements described in the present specification and the drawings exhibit technical utility individually or by various combinations thereof, and are not limited to the combinations stated in the Claims in the application. The technology described in the present specification or the drawings is for achieving a plurality of purposes simultaneously, and has technical utility by achieving one of these purposes.

What is claimed is:

1. A film forming apparatus for forming a film on a wafer, the film forming apparatus comprising:
    a chamber in which the wafer is located;
    a gas introducing member configured to introduce raw material gas into the chamber, wherein the raw material gas turns into by-product gas and a substance which adheres to a surface of the wafer by reacting at the surface of the wafer; and
    a reverse reaction member configured to generate the raw material gas by causing the by-product gas to react in the chamber.

2. The film forming apparatus of claim 1, wherein:
    the wafer made of silicon is located in the chamber,
    the gas introducing member introduces first raw material gas and second raw material gas into the chamber, wherein the second raw material gas includes silicon,
    the first raw material gas and the second raw material gas turn into the by-product gas and a silicon crystal which adheres to the surface of the wafer by reacting with each other at the surface of the wafer, and
    the reverse reaction member comprises a reverse reaction material including silicon, and creates the first raw material gas and the second raw material gas by causing the reverse reaction material to react with the by-product gas.

3. The film forming apparatus of claim 2, wherein:
    the reverse reaction material is a silicon block placed on a path of the by-product gas flowing in the chamber, and
    the film forming apparatus further comprises a first heating member for heating the silicon block and a second heating member for heating the wafer to a higher temperature than the silicon block.

4. The film forming apparatus of claim 2, wherein the reverse reaction material is placed on a path along which gas convecting in the chamber flows from a peripheral edge of the wafer to a confluent point with the raw material gas.

5. The film forming apparatus of claim 2, further comprising: a holder comprising a mounting portion on which the wafer is mounted; and
    a bladed wheel comprising a plurality of blades located around the mounting portion of the holder, wherein
    the bladed wheel is configured to send gas from above the holder to an outer circumference side of the holder when the bladed wheel rotates around the holder, and
    the blades are made of the reverse reaction material.

6. The method for forming a film on a surface of a wafer located in a chamber, the method comprising:
    generating by-product gas and a substance which adheres to the surface of the wafer by introducing raw material gas into the chamber and causing the raw material gas to react at the surface of the wafer; and
    generating the raw material gas in the chamber by causing the by-product gas to react in the chamber.

* * * * *